(12) United States Patent
Yu et al.

(10) Patent No.: US 6,239,008 B1
(45) Date of Patent: May 29, 2001

(54) METHOD OF MAKING A DENSITY MULTIPLIER FOR SEMICONDUCTOR DEVICE MANUFACTURING

(75) Inventors: Allen S. Yu, Fremont; Paul J. Steffan, Elk Grove; Thomas C. Scholer, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/407,907

(22) Filed: Sep. 29, 1999

(51) Int. Cl.[7] .............................................. H01L 21/3205
(52) U.S. Cl. ...................... 438/587; 438/592; 438/598; 438/669; 438/671; 438/684
(58) Field of Search ................................. 438/587, 592, 438/598, 669, 671, 684

(56) References Cited

U.S. PATENT DOCUMENTS

| | | | | |
|---|---|---|---|---|
| 5,017,515 | * | 5/1991 | Gill | 437/229 |
| 5,310,693 | * | 5/1994 | Hsue | 437/43 |
| 5,330,924 | * | 7/1994 | Huang et al. | 437/43 |
| 5,378,646 | * | 1/1995 | Huang et al. | 437/47 |
| 5,429,988 | * | 7/1995 | Huang et al. | 437/187 |
| 5,888,904 | * | 3/1999 | Wu | 438/682 |
| 5,981,384 | * | 11/1999 | Juengling | 438/669 |
| 6,117,760 | * | 9/2000 | Gardner et al. | 438/669 |
| 6,124,197 | * | 9/2000 | Fulford | 438/618 |

* cited by examiner

Primary Examiner—John F. Niebling
Assistant Examiner—Lynne A. Gurley
(74) Attorney, Agent, or Firm—H. Donald Nelson

(57) ABSTRACT

A method of manufacturing a semiconductor device with increased density of structures that have at least one dimension less than that provided by the lithography system being used in the manufacturing process.

9 Claims, 3 Drawing Sheets

METHOD OF MAKING A DENSITY MULTIPLIER FOR SEMICONDUCTOR DEVICE MANUFACTURING

BACKGROUND OF THE INVENTION

1. Field of the Invention

This invention relates generally to a method of manufacturing high density, high performance semiconductor devices that have structures with dimensions less than conventionally available from current semiconductor manufacturing technology. More specifically, this invention relates to a method of manufacturing high density, high performance semiconductor devices with structures that have selectable dimensions less than dimensions conventionally available from current semiconductor manufacturing technology. Even more specifically, this invention relates to a method of manufacturing high density, high performance semiconductor devices with structures that have selectable dimensions less than dimensions conventionally available from current photolithography technology.

2. Discussion of the Related Art

The industry demand for reduced price products containing semiconductor devices is increasing at an ever-increasing rate. The increased demand for improved high performance products is being met by improving performance at the functional level of the semiconductor device circuitry. As these products become commodities, and in view of the increasing price erosion for these products, it is becoming increasingly necessary to manufacture these products at reduced cost. One example of cost reduction is to decrease the manufacturing cycle time thereby increasing factory capacity. Another example of cost reduction is to reduce the total number of process steps to manufacture the product. A further example of cost reduction is to increase the density by packing more transistors into a given area of silicon. This makes more die per wafer available for sale to further amortize the cost of the product.

Typically, an increase in density is dependent on feature size reduction such as shrinking the minimum dimensions from 500 nm to 350 nm to 250 nm with smaller decrements in between each step down. As price erosion continues, more density, that is, more die per wafer, is required to maintain the average selling price for a fixed area of silicon. Unfortunately, requirements to shrink the feature size have surpassed the current available semiconductor manufacturing technology with the major bottleneck being the minimum feature size available from current photolithography technology. Although the following discussion is about polysilicon gate structures it should be appreciated that the discussion is also applicable to other structures.

The photoresist mask that defines the gate structures dictates the future polysilicon shape and width of the gate with one of its metrics being a critical dimension (CD). It is important to have a near vertical photoresist profile for the gate mask since some of the photoresist will be consumed during the etch process, which requires that the critical dimension at the top of the photoresist is the same as at the bottom. This etch induced consumption will change the feature size and shape of the photoresist mask. The underlying polysilicon gate will be replicated from the shape of the photoresist mask. Therefore, an imperfect gate mask will result in undesirable polysilicon gates and poor critical dimension control.

In leading state-of-the-art process technologies, there have been attempts to reduce the final dimension or critical dimension beyond the minimum dimension. Some of these attempts include a process of over-exposing the photoresist. Another method is to trim the printed feature size utilizing an etch process. However, these methods only reduce the main feature size while the overall space between adjacent features increases.

Because the pitch of the device (the length of one feature and one space) does not decrease, there is no gain in density. The ultimate limiting factors are the parameters of the manufacturing process that limit the minimum achievable pitch. Some of the limiting factors are the parameters of the lithographic system being used to manufacture the semiconductor device. For example, one limiting factor is the wavelength of the radiation utilized to transfer the pattern on the reticle to the photoresist on the wafer being manufactured.

Another limiting factor of a photolithographic system is the quality of the lens systems that reduces the image on the reticle to that which is imaged onto the wafer, typically a 5×reduction. In order to improve the photolithographic system, various steps have been pursued one of which is to reduce the wavelength of the illuminating radiation. Currently, ultraviolet (UV) is used, however the lens materials available that will efficiently transmit ultraviolet radiation are limited and those that are available are expensive.

Other radiation sources such as x-ray or electron-beam lithography systems have been proposed as well. These alternative sources have the potential to further decrease the feature size of the resulting semiconductor device. However, the systems utilizing x-ray or electron-beam source are extremely expensive and require extensive shielding.

Another alternative to the current technology utilizes a deep ultraviolet (DUV) for quarter micron process technology, using a source radiation having a wavelength of 248 nm. To insure the printed minimum features have an acceptable depth of focus and photoresist profile, the printed features are usually targeted to be slightly larger than the illuminating wavelength. In some cases, optical proximity correction (OPC) and phase shift (PS) are also used to enhance the image when printing is at or below the wavelength of illuminating radiation. However, these methods are very expensive and the density increase is only a comparatively small gain and as such does not justify the cost that is associated with these exotic methods.

Therefore, what is needed is a method of manufacturing a semiconductor device, utilizing the currently available photolithographic systems that can provide a feature size substantially smaller without the use of the more expensive lithographic systems.

SUMMARY OF THE INVENTION

According to the present invention, the foregoing and other objects and advantages are attained by a method of manufacturing semiconductor devices having structures with at least one dimension less than that provided by the lithography system being used in the manufacturing process.

In accordance with an aspect of the invention, structures of a semiconductor material such as polysilicon are formed on a layer of another semiconductor material. The structures made from the polysilicon material have at least one dimension less than a dimension achievable from the lithography system being used in the manufacturing process.

In accordance with another aspect of the invention, structures made from polysilicon are formed between the polysilicon structures previously formed thus doubling the density of the polysilicon structures.

The method of the present invention thus provides a method of manufacturing a semiconductor device having an increased density of structures that have at least one dimension less than that achievable by the lithography system being used in the manufacturing process.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1A shows a partially completed semiconductor device including a first layer, a layer of polysilicon formed on the first layer and a layer of photoresist formed on the layer of polysilicon with the photoresist patterned to ½ the pitch x;

FIG. 1B shows the partially completed semiconductor device as shown in FIG. 1A with the pattern of photoresist trimmed to have a dimension of $\frac{1}{4}^{th}$ the pitch x;

FIG. 1C shows the partially completed semiconductor device as shown in FIG. 1B with the layer of polysilicon etched down to the first layer;

FIG. 1D shows the partially completed semiconductor device as shown in FIG. 1D with the remaining portions of the photoresist removed leaving polysilicon structures with a dimension of $\frac{1}{4}^{th}$ the pitch x;

FIG. 1E shows the partially completed semiconductor device as shown in FIG. 1D with spacers formed on the remaining polysilicon structures;

FIG. 1F shows the partially completed semiconductor device as shown in FIG. 1E with a layer of polysilicon formed on the surface of the semiconductor device;

FIG. 1G shows the partially completed semiconductor device as shown in FIG. 1F after a planarization process; and FIG. 1H shows the partially completed semiconductor device as shown in FIG. 1G with the spacer material removed leaving polysilicon structures with dimensions of ¼ x and a pitch of ½ the conventionally achievable pitch x.

DETAILED DESCRIPTION

Reference is now made in detail to specific embodiments of the present invention that illustrate the best mode presently contemplated by the inventors for practicing the invention.

FIGS. 1A–1H illustrate a method of manufacturing a feature having a reduced dimension of $\frac{1}{2}^{th}$ the pitch available from conventional semiconductor manufacturing equipment. It is noted that the method illustrated in FIGS. 1A–1H is for a reduction in size to $\frac{1}{2}^{th}$ the pitch, however it is to be appreciated that the method is applicable to other fractional reductions such as, for example, $\frac{1}{3}^{rd}$ and $\frac{2}{3}$rds. The reduction in size can include a fraction between the value of greater than zero and less than or equal to one half the minimum achievable pitch.

Figure 1A:
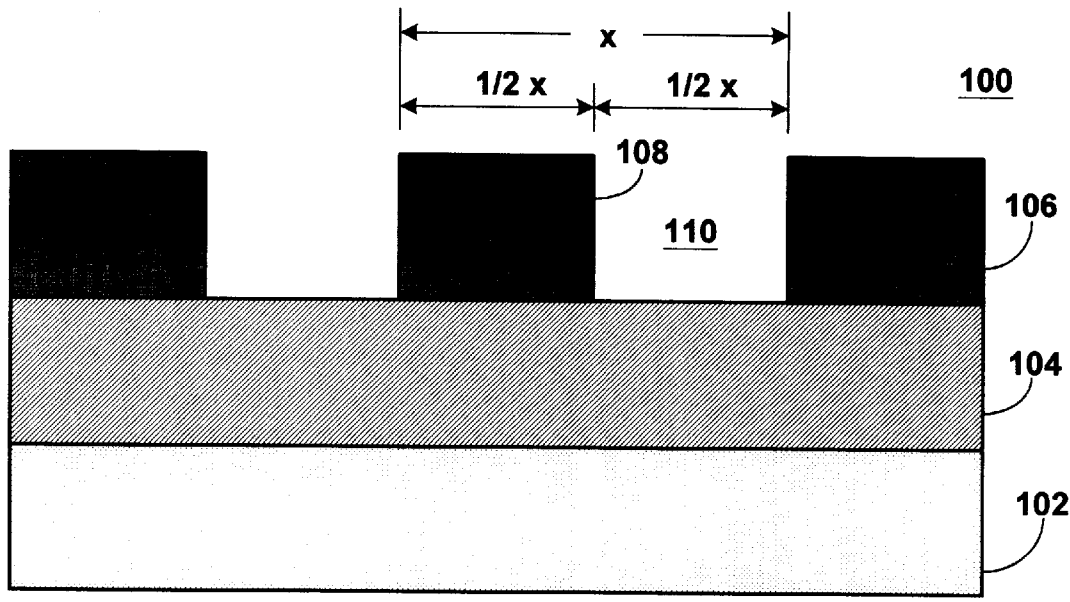
FIGS. 1A–1H illustrate a method of manufacturing a feature having a dimension of $\frac{1}{4}^{th}$ the pitch available from a conventional methods using a lithography system.

FIG. 1A shows a portion 100 of a partially completed semiconductor device having a layer 102 of semiconductor material, a layer 104 of a semiconductor material, such as polysilicon formed on the layer 102 and a layer 106 of photoresist formed on the layer 104 of polysilicon. The layer 102 of semiconductor material can be any layer on which structures are to be formed. The layer 104 of a semiconductor material is formed as a solid layer and is etched to form structures in accordance with a pattern that is formed in the layer 106 of photoresist. The layer 106 of photoresist is patterned and developed as shown in FIG. 1A. The dimension x is the pitch available from the manufacturing system being utilized. The pitch, as is shown is from one side of a structure 108, across the structure and a space 110. The dimension of the structure 108 is ½ x and the dimension of the space 110 is ½ x. The dimension ½ x is the minimum printable dimension.

Figure 1B:
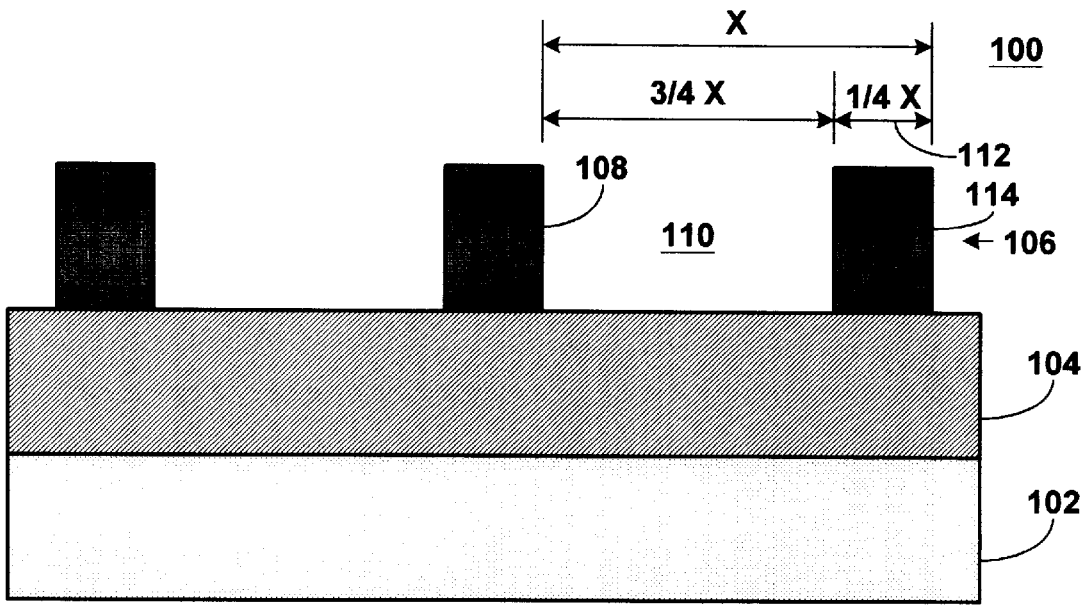

FIG. 1B shows the portion 100 of the partially completed semiconductor device as shown in FIG. 1A after a process that trims the photoresist structures, such as structure 108, of layer 106 of photoresist to a reduced dimension such as ¼ x as shown at 112 for the structure 114. As should be appreciated, when the structures 108 & 114 on either side of space 110 are reduced to ¼ x, the space 110 in increased to ¾ x.

Figure 1C:
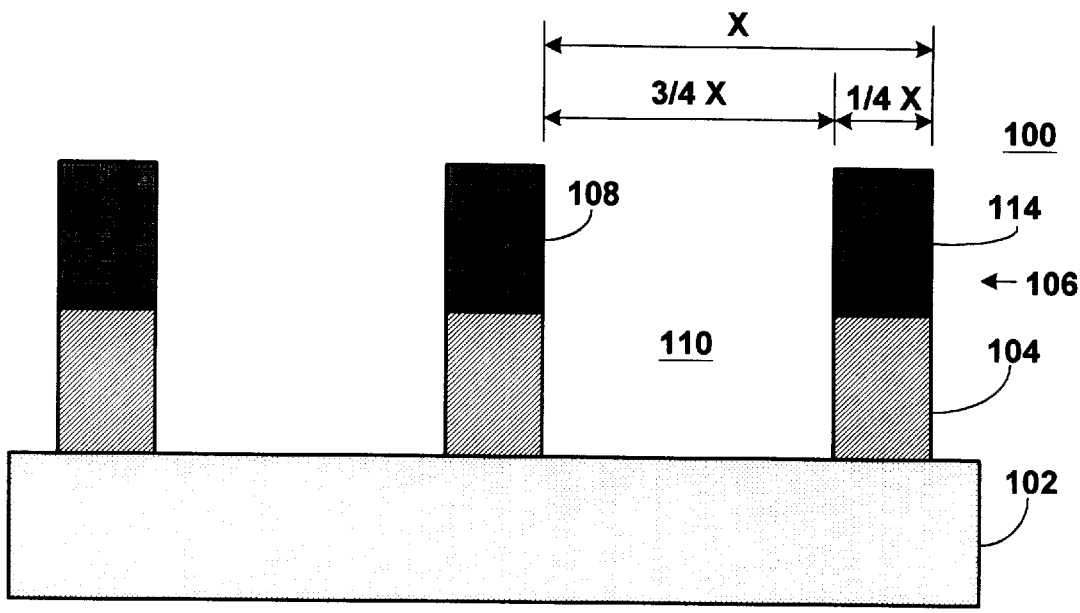

FIG. 1C shows the portion 100 of the partially completed semiconductor device as shown in FIG. 1B after an etch process to remove the exposed portions of the layer 104 of polysilicon. The exposed portions of the layer 104 of semiconductor material are removed to the layer 102.

Figure 1D:
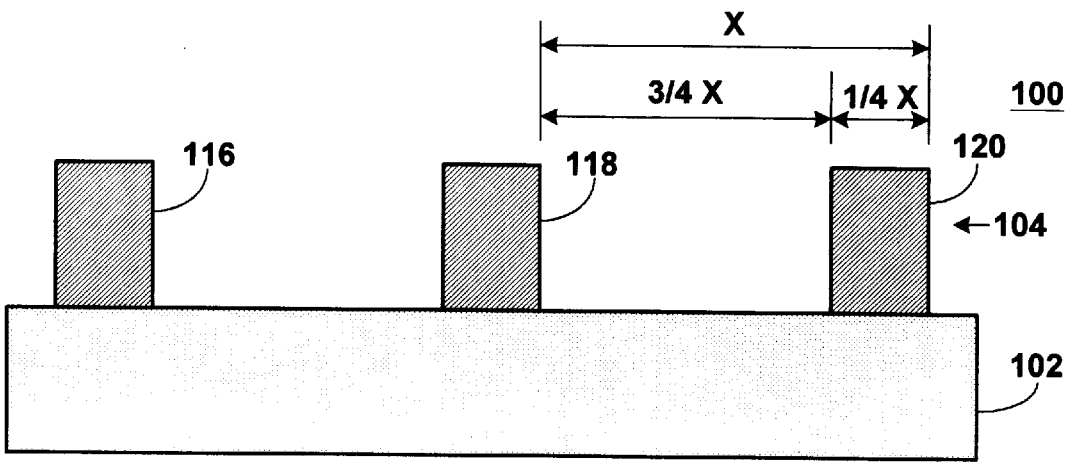

FIG. 1D shows the portion 100 of the partially completed semiconductor device as shown in FIG. 1C with the remaining portions of the layer 106 of photoresist removed exposing structures 116, 118 and 120.

Figure 1E:
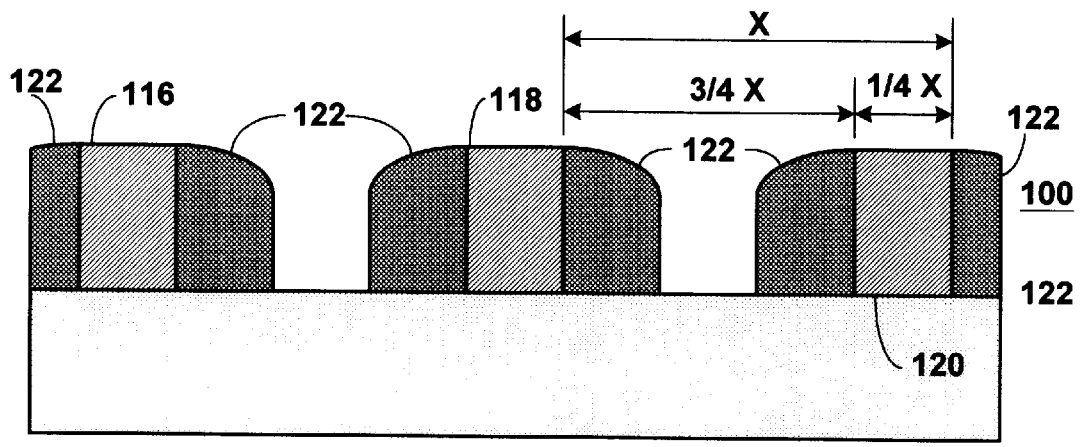

FIG. 1E shows the portion 100 of the partially completed semiconductor device as shown in FIG. 1D after a process in which a blanket layer of film such as an oxide, nitride or oxynitride is deposited over the features of the portion 100 of the partially completed semiconductor device. The blanket layer of oxide, nitride or oxynitride is anisotropically etched so that spacers 122 are formed on the sidewalls of the structures 116, 118 and 120. The structures 116, 118 and 120 with the two spacers formed on each side each have a dimension of ¾ x. Accordingly, each of the spaces between the structures 116, 118 and 120 and the associated spacers 122 now have a dimension ¼ x.

Figure 1F:
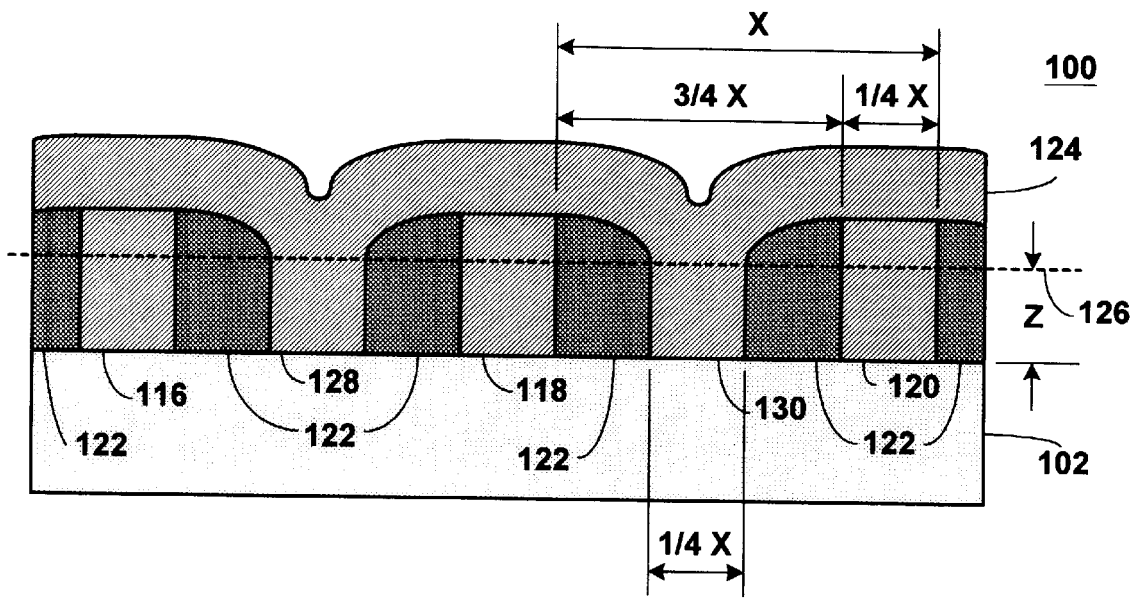

FIG. 1F shows the portion 100 of the partially completed semiconductor device as shown in FIG. 1E with a blanket layer 124 of semiconductor material deposited over the surface of the portion 100 of the partially completed semiconductor device. The blanket layer 124 is a material similar to or the same material from which structures 116, 118 and 120 is made. The dashed line 126 indicates the final height of the structures 116, 118, 120 and the new structures that are formed at 128 and 130.

Figure 1G:
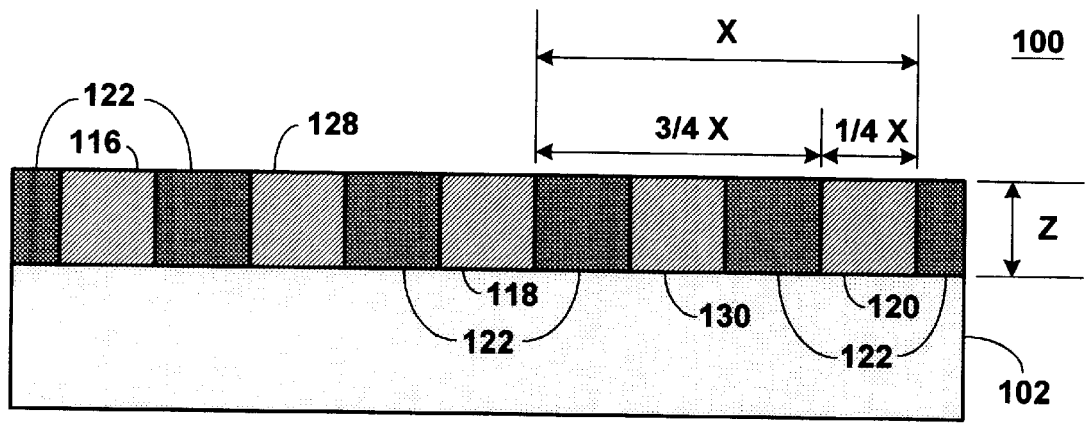

FIG. 1G shows the portion 100 of the partially completed semiconductor device as shown in FIG. 1F after a planarization that removes material so that the final height of the structures 116, 118 120, 128 and 130 is equal to the dimension z. At this stage, because the spacers 122 are a dielectric material, they can serve as a self-aligned protect process for the implantation of the source and drain regions if the devices being manufactured are FETs.

Figure 1H:
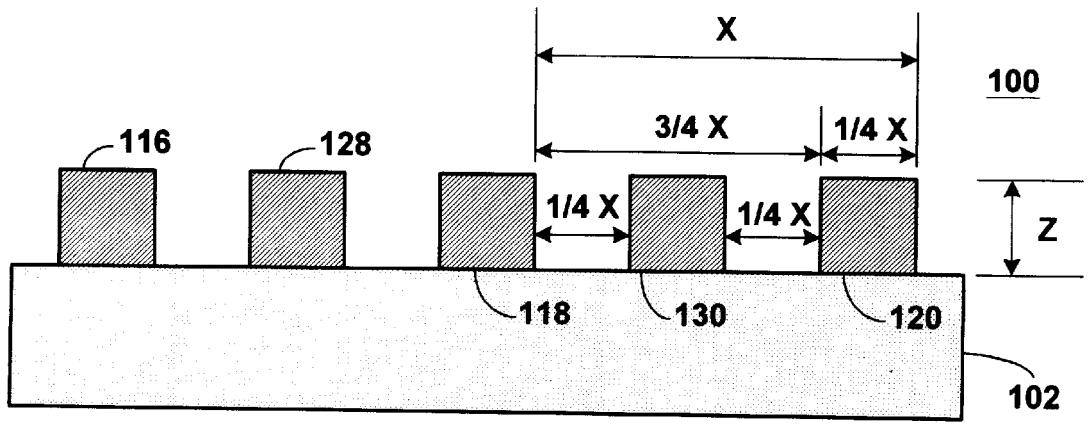

FIG. 1H shows the portion 100 of the partially completed semiconductor device as shown in FIG. 1G after the spacers 122 have been removed leaving the structures 116, 128, 118, 130 and 120. The structures 116, 128, 118, 130 and 120 have a dimension of ¼ x and the spaces between the structures have a dimension of ¼ x and that the second set of structures, 128 & 130 are self-aligned between the original set of structures 116, 118 and 120. As can be appreciated, decreasing the dimensions of the spaces and the structures to ¼ x doubles the density in a fixed area of silicon. In addition, the structures 116, 128, 118, 130 and 120 can be salicided with metals such as tungsten, titanium, nickel, or cobalt to reduce the sheet resistance. The removal of the spacers 122 allows for further process such as implantation to form channels and junctions.

As can be appreciated, this invention is most suited for the manufacturing of semiconductor devices with massively repeating features such as DRAM and Flash memory devices. In Flash memory devices, the device consists of control gates vertically overlapping the floating gates in rows and columns. The use of the present invention doubles the number of rows (floating gates) and columns (control gates). This results in a quadrupling of the density in the same fixed area of silicon. In addition, the present invention is forward compatible for the next generation of lithography systems such as x-ray and electron beam systems.

The advantages of the present invention include:
1. a significant increase in density;
2. an extension of the use of current photolithographic systems;
3. a self-aligning density doubler; and
4. a self-aligning salicide process.

In summary, the method of the present invention overcomes the limitations of the prior art and fulfills the need for a method of manufacturing a semiconductor device having an increased density of structures that have at least one dimension less than that achievable by the lithography system being used in the manufacturing process.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device in a manufacturing system that includes a lithography system, the method comprising:
    (a) forming a second layer of a semiconductor material on a first layer of semiconductor material;
    (b) forming a layer of photoresist on the second layer of semiconductor material;
    (c) forming at least one pattern in the layer of photoresist having at least one dimension less than a minimum dimension achievable by the lithography system, whereby portions of the second layer of semiconductor material are exposed;
    (d) etching the exposed portions of the second layer of semiconductor material down to the first layer of semiconductor material;
    (e) removing the layer of photoresist, whereby structures of the second layer of semiconductor material remain on a surface of the first layer of semiconductor material; and
    (f) forming structures made of a third semiconductor material on the surface of the first layer of semiconductor material between the structures of the second layer of semiconductor material that remain on the surface of the first layer of semiconductor material, whereby a density of structures on the surface of the first layer of semiconductor material is increased.

2. The method of claim 1, whereby step (c) includes:
    (g) forming the at least one pattern in the layer of photoresist with the at least one dimension equal to the minimum dimension achievable by the lithography system;
    (h) developing the photoresist forming at least one photoresist structure with the at least one dimension having the minimum dimension achievable by the lithography system; and
    (i) trimming the at least one photoresist structure, whereby the at least one dimension of the at least one photoresist structure is less than the minimum dimension achievable by the lithography system.

3. The method of claim 1, whereby step (f) includes:
    (j) forming side wall spacers on the structures of the second layer of semiconductor material that remain on a surface of the first layer of semiconductor material;
    (k) forming a blanket layer of the third semiconductor material on a surface of the first layer of semiconductor material between the side wall spacers;
    (l) planarizing a surface of the blanket layer of the third semiconductor material down to the structures of the second layer of semiconductor material; and
    (m) removing the sidewall spacers, whereby structures formed of the third semiconductor material remain between structures of the second semiconductor material.

4. The method of claim 1 wherein the third semiconductor material is the same as the second semiconductor material.

5. The method of claim 3 wherein step (j) includes:
    (n) forming a blanket layer of a material selected from silicon oxide, silicon nitride and silicon oxynitride; and
    (o) anisotropically etching the blanket layer, whereby sidewall spacers are formed on the structures of the second semiconductor material.

6. The method of claim 1 wherein the at least one dimension less than a minimum dimension achievable by the lithography system in step (c) includes a fraction between a value greater than zero and less than or equal to one half.

7. The method of claim 6 wherein the lithography system being used is a photolithography system.

8. The method of claim 6 wherein the lithography system being used is an x-ray lithography system.

9. The method of claim 6 wherein the lithography system being used is an electron-beam lithography system.

* * * * *